US009135990B2

(12) United States Patent
Takahashi et al.

(10) Patent No.: US 9,135,990 B2
(45) Date of Patent: Sep. 15, 2015

(54) DRIVE METHOD FOR MEMORY ELEMENT, AND STORAGE DEVICE USING MEMORY ELEMENT

(75) Inventors: Tsuyoshi Takahashi, Tsukuba (JP); Yuichiro Masuda, Tsukuba (JP); Shigeo Furuta, Tsukuba (JP); Touru Sumiya, Tsukuba (JP); Masatoshi Ono, Tsukuba (JP); Yutaka Hayashi, Tsukuba (JP); Toshimi Fukuoka, Tsukuba (JP); Tetsuo Shimizu, Tsukuba (JP); Kumaragurubaran Somu, Tsukuba (JP); Hiroshi Suga, Narashino (JP); Yasuhisa Naitou, Tsukuba (JP)

(73) Assignees: National Institute of Advanced Industrial Science and Technology, Tokyo (JP); Funai Electric Co., Ltd., Daito-shi (JP)

( * ) Notice: Subject to any disclaimer, the term of this patent is extended or adjusted under 35 U.S.C. 154(b) by 373 days.

(21) Appl. No.: 13/819,217

(22) PCT Filed: Aug. 25, 2011

(86) PCT No.: PCT/JP2011/069113
§ 371 (c)(1),
(2), (4) Date: Feb. 26, 2013

(87) PCT Pub. No.: WO2012/026506
PCT Pub. Date: Mar. 1, 2012

(65) Prior Publication Data
US 2013/0155757 A1 Jun. 20, 2013

(30) Foreign Application Priority Data

Aug. 26, 2010 (JP) ................. 2010-189132

(51) Int. Cl.
*G11C 11/00* (2006.01)
*G11C 13/00* (2006.01)
*G11C 17/16* (2006.01)

(52) U.S. Cl.
CPC .......... *G11C 13/0002* (2013.01); *G11C 13/003* (2013.01); *G11C 13/0069* (2013.01);

(Continued)

(58) Field of Classification Search
CPC ...................................................... G11C 11/00
USPC ............ 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS

2002/0122217 A1\* 9/2002 Nakajima ..................... 358/505
2008/0123393 A1 5/2008 Kinoshita
(Continued)

FOREIGN PATENT DOCUMENTS

CN 101273461 A 9/2008
JP 2007-123828 A 5/2007
(Continued)

OTHER PUBLICATIONS
International Search Report dated Oct. 25, 2011 w/English translation (four (4) pages).

*Primary Examiner* — Harry W Byrne
(74) *Attorney, Agent, or Firm* — Crowell & Moring LLP

(57) ABSTRACT

A memory element includes an insulating substrate; a first electrode and a second electrode on the insulating substrate; and an inter-electrode gap portion that causes a change in resistance value between the first and second electrodes. Applied to the memory element from a pulse generating source is a first voltage pulse for shifting from a predetermined low-resistance state to a predetermined high-resistance state, and a second voltage pulse for shifting from the high-resistance state to the low-resistance state through a series-connected resistor, by which current flowing to the memory element after the change to a low resistance value is reduced. When shifting from the high to the low-resistance state, a voltage pulse is applied such that an electrical resistance between the pulse generating source and the memory element becomes higher than the electrical resistance shifting from the low to the high-resistance state.

6 Claims, 7 Drawing Sheets

(52) U.S. Cl.
CPC .......... *G11C17/16* (2013.01); *G11C 2013/009* (2013.01); *G11C 2213/33* (2013.01); *G11C 2213/52* (2013.01); *G11C 2213/74* (2013.01); *G11C 2213/79* (2013.01)

(56) References Cited

U.S. PATENT DOCUMENTS

| | | | |
|---|---|---|---|
| 2009/0161407 A1* | 6/2009 | Masuda et al. | 365/148 |
| 2009/0190392 A1* | 7/2009 | Sasaki | 365/159 |
| 2009/0251199 A1 | 10/2009 | Naitoh et al. | |
| 2010/0202185 A1 | 8/2010 | Katoh et al. | |
| 2011/0317481 A1* | 12/2011 | Franceschini et al. | 365/163 |

FOREIGN PATENT DOCUMENTS

| | | |
|---|---|---|
| JP | 2008-517407 A | 5/2008 |
| JP | 2009-205709 A | 9/2009 |
| JP | 2010-157568 A | 7/2010 |
| WO | WO 2006/036622 A1 | 4/2006 |
| WO | WO 2006/137111 A1 | 12/2006 |
| WO | WO 2007/074504 A1 | 7/2007 |
| WO | WO 2009/034687 A1 | 3/2009 |

\* cited by examiner

US 9,135,990 B2

DRIVE METHOD FOR MEMORY ELEMENT, AND STORAGE DEVICE USING MEMORY ELEMENT

TECHNICAL FIELD

The present invention relates to a drive method for a memory element including nano-gap electrodes, and a storage device using the memory element.

BACKGROUND ART

At present, with the miniaturization and increase in the density of devices, finer electric elements are desired. As one example thereof, there is known an element capable of performing switching operation by applying a voltage between two electrodes with a fine gap (nano-gap) provided therebetween.

Specifically, for example, an element is developed that is made of stable materials (silicon oxide and gold), fabricated by a simple fabrication method (oblique deposition) and can stably and repeatedly perform switching operation (see, for example, Patent Literature 1).

In such an element having a nano-gap (hereinafter, referred to as a "nano-gap memory element"), to perform writing or erasing, a shift (transition) from a high-resistance state (OFF state) to a low-resistance state (ON state) or a shift from the low-resistance state (ON state) to the high-resistance state (OFF state) is performed by application of a voltage pulse having a predetermined voltage value.

PRIOR ART LITERATURE

Patent Literature

Patent Literature 1: JP 2007-123828 A

SUMMARY OF INVENTION

Problem to be Solved by the Invention

However, there is a problem that particularly when a transition from the high-resistance state to the low-resistance state is performed, the probability of a transition to a desired resistance state (low-resistance state) is low even if a voltage pulse is applied. Hence, to improve the probability of transition from the high-resistance state to the low-resistance state, countermeasures such as increasing the pulse width (i.e., the application time of one voltage pulse), increasing the voltage value, and the like are considered. However, these methods have a problem that the probability of a transition from the high-resistance state to the low-resistance state is still not sufficient.

An object of the present invention is to provide a drive method for a memory element that allows the memory element to shift from a high-resistance state to a low-resistance state with high probability, and a storage device using the memory element.

Means to Solve the Problem

According to a first aspect of the present invention, there is provided a drive method for a memory element that includes an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs by application of a predetermined voltage between the first electrode and the second electrode. A state of the memory element can be shifted (transitioned) from a predetermined low-resistance state to a predetermined high-resistance state and from the high-resistance state to the low-resistance state by application of a voltage pulse. The method includes a step of reducing a current value after a change of a resistance value, by performing, at least upon shifting from the high-resistance state to the low-resistance state, application of a voltage pulse to a memory element from a pulse generating source through a series-connected resistor; and a step of performing application of the voltage pulse, in a case of shifting (transition) from the high-resistance state to the low-resistance state, such that an electrical resistance between the pulse generating source and the memory element becomes higher than the electrical resistance in a case of shifting from the low-resistance state to the high-resistance state.

A second aspect of the present invention includes the same configuration as the first aspect of the invention, and the resistance value of the resistor in the case of shifting from the high-resistance state to the low-resistance state is from 2 MΩ to 0.5 MΩ.

According to a third aspect of the present invention, there is provided a storage device that includes a memory element including an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs by application of a predetermined voltage between the first electrode and the second electrode; and a voltage applying unit that applies a voltage pulse to perform shifting from a predetermined low-resistance state to a predetermined high-resistance state and shifting from the high-resistance state to the low-resistance state between the first and second electrodes of the memory element. The voltage applying unit includes a pulse generating source that generates a constant voltage pulse; a resistor for reducing current after a change of a resistance value that flows through the memory element by the voltage pulse applied at least upon shifting from the high-resistance state to the low-resistance state; and a switching unit that performs switching such that, in a case of shifting from the high-resistance state to the low-resistance state, an electrical resistance between the pulse generating source and the memory element becomes higher than the electrical resistance in a case of shifting from the low-resistance state to the high-resistance state.

According to a fourth aspect of the present invention, there is provided a storage device that includes a plurality of memory elements, each includes an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs by application of a predetermined voltage between the first electrode and the second electrode; and a voltage applying unit that applies a voltage pulse to perform shifting from a predetermined low-resistance state to a predetermined high-resistance state and shifting from the high-resistance state to the low-resistance state between the first and second electrodes of the memory element. A resistor is connected to each of the plurality of memory elements, and the voltage applying unit includes a switching unit that performs switching such that, in a case of shifting from the high-resistance state to the low-resistance state, an electrical resistance between the pulse generating source and the memory element becomes higher than the electrical resistance in a case of shifting from the low-resistance state to the high-resistance state.

By this configuration, the write speed is improved. Although there is a possibility of an increase in memory cell area, if the resistor and the electrodes of the memory element can be formed in a stacked layer structure, then the increase in memory cell area can be avoided.

A fifth aspect of the present invention includes the same configuration as the third or fourth aspect of the invention, and the resistance value of the resistor in the case of shifting from the high-resistance state to the low-resistance state is from 2 MΩ to 0.5 MΩ.

Advantageous Effects of the Invention

As a result of diligent studies to solve the above problem, the inventors have focused on applying a voltage pulse that switches a resistance state to a memory element from a pulse generating source through a series-connected resistor. The inventors have found that by performing such voltage pulse application, the memory element changes its state from a high-resistance state to a low-resistance state with higher probability.

According to the present invention, in a memory element including an inter-electrode gap portion having a gap of the order of nanometers which a shift (transition) from a predetermined low-resistance state to a predetermined high-resistance state and a shift from the high-resistance state to the low-resistance state are performed by application of a voltage pulse, at least upon the shift from the high-resistance state to the low-resistance state, application of a voltage pulse to the memory element is performed through a series-connected resistor. By virtue of the step, upon the application of a voltage pulse, the current that flows through the memory element after changed to a low resistance value is reduced.

Conventionally, the success rate of switching from the high-resistance state to the low-resistance state is lower than that of switching from the low-resistance state to the high-resistance state. However, by applying a voltage pulse in the above-described manner, the success rate of switching from the high-resistance state to the low-resistance state can be dramatically improved.

For example, in a rewrite repeating test in which switching from the low-resistance state to the high-resistance state and switching from the high-resistance state to the low-resistance state are alternately performed, switching of the state between the low-resistance state and the high-resistance state is more securely performed, and a range to which resistance values for the low-resistance state belongs and a range to which resistance values for the high-resistance state belongs are separated with almost no overlap between the ranges. As a result, the memory element can be maintained at two identifiable states, enabling to further improve adaptability as a storage device.

DESCRIPTION OF EMBODIMENTS

Figure 1A:
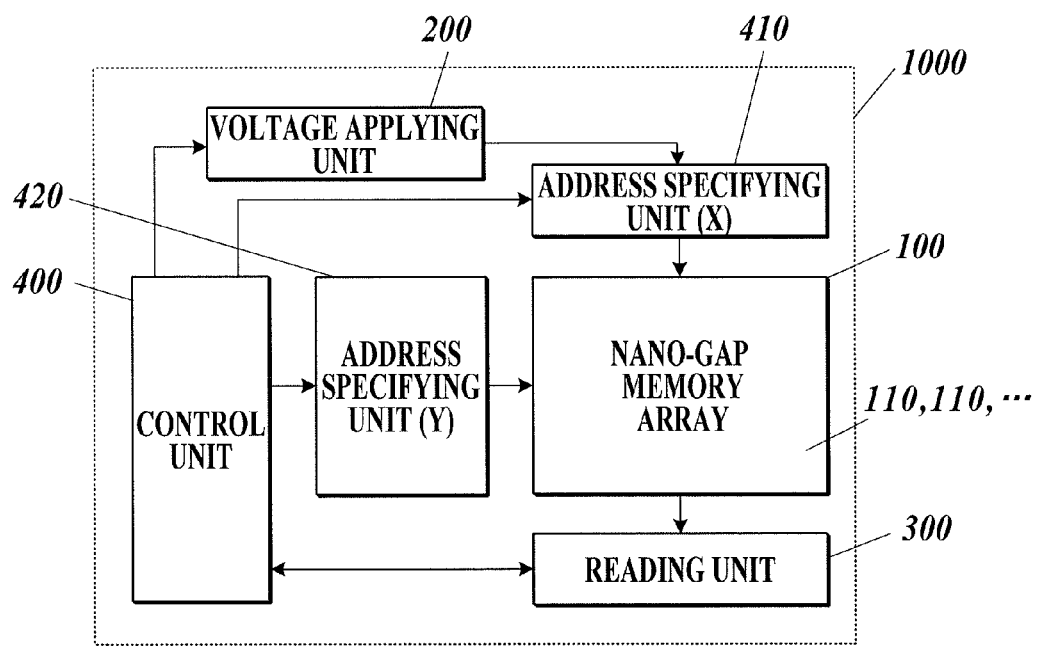
FIG. 1A is a block diagram showing a functional configuration of a storage device of the present invention.

Embodiments of the present invention will be explained below using the drawings. Note, however, that the scope of the invention is not limited to the embodiments shown in the drawings.

<Storage Device Including Nano-Gap Memory Elements>

First, a configuration of a storage device 1000 will be explained with reference to FIGS. 1A to 3.

The storage device 1000 is a data-storing device that includes a memory element array in which a plurality of memory cells 110 are arranged in an array. Here, in the storage device 1000 of the present invention, each memory cell 110 is composed of a nano-gap memory element 10 and a MOS transistor 11 serving as a selection element. The memory element array is a nano-gap memory array 100.

Specifically, the storage device 1000 is configured to include, for example, as shown in FIG. 1A, the nano-gap memory array 100, a voltage applying unit 200, a reading unit 300, a control unit 400, an X-direction address specifying unit 410 that specifies the location in an X-direction of a memory cell 110 to select one of the memory cells 110 arranged side by side in an array, a Y-direction address specifying unit 420 that specifies the location in a Y-direction of the memory cell 110, and the like.

(Nano-Gap Memory Array)

The nano-gap memory array 100 is, for example, a high-density memory in which the plurality of memory cells 110 are arranged in an array (e.g., two-dimensional array).

Figure 1B:
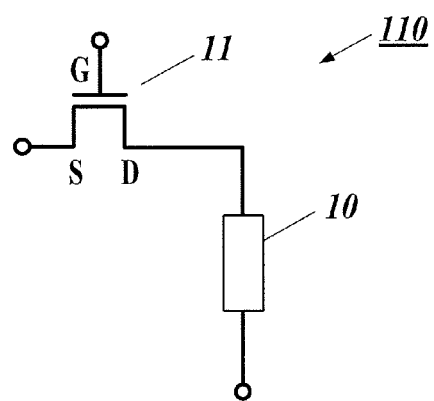
FIG. 1B is a diagram showing a structure of one memory cell included in a nano-gap memory array of a storage device.

Each memory cell 110 is composed of, as shown in FIG. 1B, the MOS transistor 11 and the nano-gap memory element 10 connected to a drain electrode or source electrode of the MOS transistor 11. The MOS transistor 11 is connected at its source electrode or drain electrode to the X-direction address specifying unit 410, and is connected at its gate electrode to the Y-direction address specifying unit 420. When a first or second voltage pulse, which will be described later, is applied through the X-direction address specifying unit 410 and a specification signal is inputted from the Y-direction address specifying unit 420, the voltage pulse is applied to the nano-gap memory element 10 by which a phenomenon of a change in resistance value, which will be described later, occurs.

(Nano-Gap Memory Element)

The nano-gap memory element 10 is, for example, a memory element that stores data by switching the resistance value between nano-gap electrodes (a gap of an inter-electrode gap portion 4).

Figure 2:
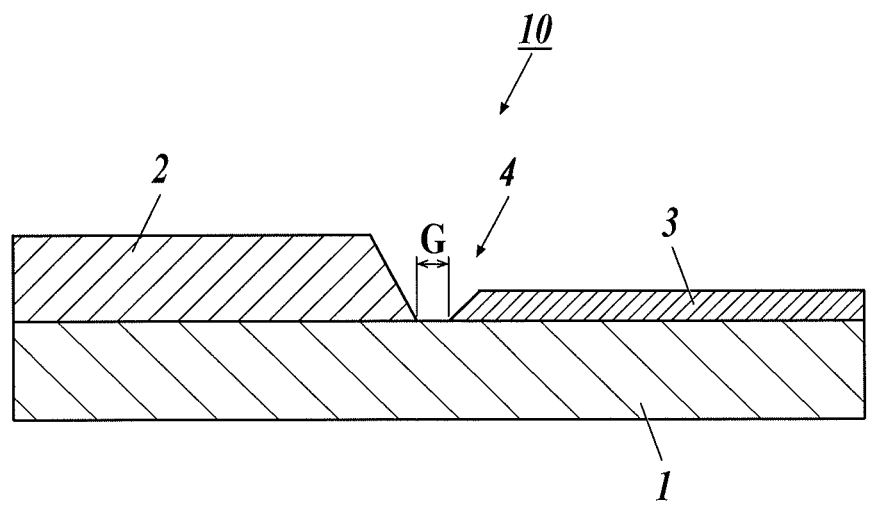
FIG. 2 is a cross-sectional view schematically showing a main part of a nano-gap memory element of a storage device of the present invention.

Specifically, the nano-gap memory element 10 is configured to include, for example, as shown in FIG. 2, an insulating substrate 1, a first electrode 2 and a second electrode 3 which are provided on one surface (top surface) of the insulating substrate 1, the inter-electrode gap portion 4 provided between the first electrode 2 and the second electrode 3, and the like.

The insulating substrate 1 functions as, for example, a support for providing two electrodes (the first electrode 2 and the second electrode 3) of the nano-gap memory element 10 such that the electrodes are spaced apart.

The structure and material of the insulating substrate 1 are not particularly limited. Specifically, for example, the surface of the insulating substrate 1 may be planar in form or may be uneven in form. In addition, the insulating substrate 1 may be, for example, a semiconductor substrate of Si, etc. on a surface of which an oxide film or the like is provided or such that the substrate itself is insulating.

For the material of the insulating substrate 1, it is preferred to use, for example, glass, oxides such as silicon oxide ($SiO_2$) and nitrides such as silicon nitride (SiN). Among them, silicon oxide ($SiO_2$) is ideal in terms of high adhesiveness to the first electrode 2 and the second electrode 3 and high flexibility in fabrication thereof.

The first electrode 2 is, for example, to perform switching operation of the nano-gap memory element 10 with the second electrode 3.

The shape of the first electrode 2 is not particularly limited, and can be appropriately and arbitrarily modified.

The material of the first electrode 2 is not particularly limited as long as the material has conductivity. For example, the material is preferably at least one selected from gold, silver, platinum, palladium, nickel, aluminum, cobalt, chromium, rhodium, copper, tungsten, tantalum, carbon, and alloys thereof. Here, in order to enhance the adhesion properties of the first electrode 2 to the insulating substrate 1, for example, two or more layers of different metals may be used overlaid on top of each other. Specifically, for example, the first electrode 2 may have a stacked layer (multilayer) structure of chromium and gold.

The second electrode 3 is, for example, to perform switching operation of the nano-gap memory element 10 with the first electrode 2.

The shape of the second electrode 3 is not particularly limited, and can be appropriately and arbitrarily modified.

The material of the second electrode 3 is not particularly limited as long as the material has conductivity. For example, the material is preferably at least one selected from gold, silver, platinum, palladium, nickel, aluminum, cobalt, chromium, rhodium, copper, tungsten, tantalum, carbon, and alloys thereof. Here, in order to enhance the adhesion properties of the second electrode 3 to the insulating substrate 1, for example, two or more layers of different metals may be used overlaid on top of each other. Specifically, for example, the second electrode 3 may have a stacked layer (multilayer) structure of chromium and gold.

The inter-electrode gap portion 4, for example, is formed between the first electrode 2 and the second electrode 3, and has the function of bringing about a phenomenon of a change in the resistance value of the nano-gap memory element 10.

Specifically, the inter-electrode gap portion 4 has, for example, a gap of the order of nanometers where a resistance switching phenomenon occurs by application of a predetermined voltage between the first electrode 2 and the second electrode 3. Namely, a distance (spacing) G between the first electrode 2 and the second electrode 3 (between the nano-gap electrodes) is set to be of the order of nanometers.

The distance (spacing) G between the first electrode 2 and the second electrode 3 (between the nano-gap electrodes) is preferably, for example, $0$ nm$<G\leq 13$ nm, and more preferably $0.8$ nm$<G<2.2$ nm.

Here, the reason that the upper limit of the distance G is set to 13 nm is that when, for example, fabrication is performed by two oblique depositions, if the gap spacing is greater than 13 nm, then switching does not occur.

When typical values for a low-resistance state and a high-resistance state are substituted into a theoretical expression for tunnel current, a range of $0.8$ nm$<G<2.2$ nm is obtained as the result of computation of a gap width.

Note that a closest part between the first electrode 2 and the second electrode 3 (the gap of the inter-electrode gap portion 4) may be, for example, formed at one or more locations in a region where the first electrode 2 and the second electrode 3 face each other.

Note also that, for example, an island portion (sandbank portion) made of constituent materials of the first electrode 2 and the second electrode 3, etc., may be formed between the first electrode 2 and the second electrode 3. In this case, it only requires that the first electrode 2 and the second electrode 3 not be short-circuited by, for example, forming a predetermined gap (the gap of the inter-electrode gap portion 4) between the first electrode 2 and the island portion and between the second electrode 3 and the island portion.

(Voltage Applying Unit)

The voltage applying unit 200 is connected, for example, to the plurality of memory cells 110 included in the nano-gap memory array 100 and to the control unit 400. The voltage applying unit 200, for example, applies a voltage (voltage pulse) between the first electrode 2 and the second electrode 3 of a nano-gap memory element 10 in a memory cell 110, according to a control signal inputted from the control unit 400, and thereby writes data to the nano-gap memory element 10 or erases data from the nano-gap memory element 10.

Specifically, for example, address information about the location of a nano-gap memory element 10 to which a voltage pulse is to be applied is inputted to the voltage applying unit 200 from the control unit 400. When the information is inputted, for example, the voltage applying unit 200 applies a voltage pulse to the nano-gap memory element 10 specified by the address information among the plurality of nano-gap memory elements 10 included in the nano-gap memory array 100.

Figure 3:
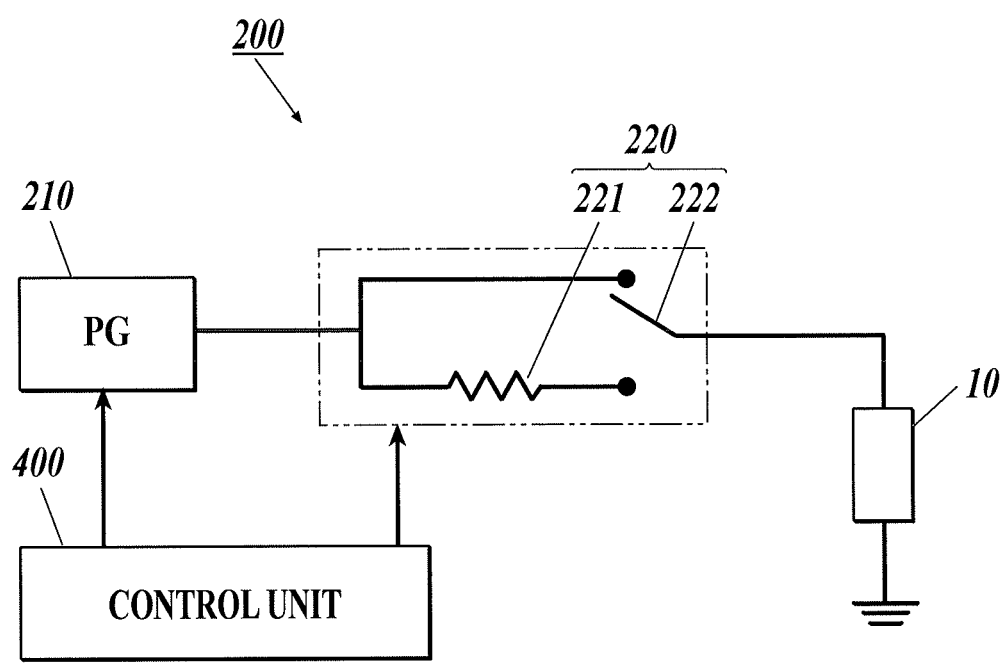
FIG. 3 is a block diagram showing a functional configuration of a voltage applying unit included in the storage device of the present invention.

In addition, the voltage applying unit 200 has a structure shown in FIG. 3 in order to apply a first voltage pulse and a second voltage pulse to each nano-gap memory element 10 for switching a low-resistance state and a high-resistance state between the first electrode 2 and the second electrode 3 of the nano-gap memory element 10.

Specifically, the voltage applying unit 200 includes a pulse generator 210 serving as a pulse generating source that generates a voltage pulse at a predetermined voltage and a predetermined pulse width, for the memory elements 10; and a switching unit 220 capable of switching a connection state, which is a first connection state or a second connection state, between the pulse generator 210 and a first electrode 2 of each nano-gap memory element 10. Note that the pulse generator 210 and the switching unit 220 are provided so as to be connected to each nano-gap memory element 10 through the X-direction address specifying unit 410. Note that although there are the address specifying unit 410 and the MOS transistor 11 in practice between the voltage applying unit 200 and each nano-gap memory element 10, they are not shown in FIG. 3.

The pulse generator 210 can output a single voltage pulse and the voltage and pulse width of the voltage pulse can be arbitrarily controlled by the control unit 400.

The switching unit 220 has a path that forms a first connection state in which the pulse generator 210 is directly connected to a first electrode 2 of a nano-gap memory element 10; and a path that forms a second connection state in which the pulse generator 210 and the first electrode 2 of the nano-gap memory element 10 are connected to each other through a resistance element 221 serving as a resistor disposed in series between the pulse generator 210 and the first electrode 2. Either path can be selectively connected by a switching element 222. Switching control of the switching element 222 is performed by the control unit 400.

When a connection is established in the first connection state by the switching unit 220, a voltage pulse outputted from the pulse generator 210 is directly applied to the nano-gap memory element 10 as a first voltage pulse.

When a connection is established in the second connection state by the switching unit 220, a voltage pulse outputted from the pulse generator 210 is applied through the resistance element 221 to the nano-gap memory element 10 as a second voltage pulse. At this time, since the resistance element 221 and the nano-gap memory element 10 can be regarded as two series-connected resistance elements, with respect to the voltage pulse, a current inversely proportional to the total resistance value of the resistance element 221 and the nano-gap memory element 10 flows through the nano-gap memory element 10, restraining a large current from flowing through the nano-gap memory element 10 having been switched to the low-resistance state. Thus, the low-resistance state of the nano-gap memory element 10 can be stably maintained so that the success rate of switching to the low resistance state is improved.

Accordingly, by the application of the second voltage pulse, the nano-gap memory element 10 can be fixed at the lowest possible resistance value in a fixable range.

In addition, when the nano-gap memory element 10 goes through a great resistance change from high resistance to low resistance upon writing data, a breakdown of the device such as a break in a wire caused by a sudden increase in current flowing through the device is prevented.

(X-Direction and Y-Direction Address Specifying Units)

The X-direction address specifying unit 410 includes a plurality of wiring lines, to each of which are connected in parallel the source electrodes of MOS transistors 11 included in a plurality of memory cells 110 arranged side by side in the Y-direction among the plurality of memory cells 110 provided in an array. The wiring lines are provided to be arranged side by side in the X-direction. A voltage pulse can be applied to the wiring lines individually from the voltage applying unit 200.

The Y-direction address specifying unit 420 includes a plurality of wiring lines, to each of which are connected in parallel the gate electrodes of MOS transistors 11 included in a plurality of memory cells 110 arranged side by side in the X-direction among the plurality of memory cells 110 provided in an array. The wiring lines are provided to be arranged side by side in the Y-direction. A voltage serving as a specification signal can be applied to the wiring lines individually, which enables each MOS transistor 11 to establish a connection between the source and drain electrodes.

That is, by applying a specification signal to a corresponding wiring line according to the specification of a location provided to the Y-direction address specifying unit 420 and applying a voltage pulse to a corresponding wiring line according to the specification of a location provided to the X-direction address specifying unit 410, application of the voltage pulse to an arbitrary nano-gap memory element 10 identified by the specification of the locations in the X- and Y-directions can be performed.

Note that by configuring the memory cell 110 such that at least a resistor is connected (the MOS transistor 11 is further connected) to the nano-gap memory element 10, the write speed can be increased. This is because the charge and discharge currents of a wiring line up to the point of the memory cell 110 are not limited due to the resistor. Although there is a possibility of an increase in memory cell area, if the resistor and the electrodes of the memory element can be formed in a stacked layer structure, then the increase in memory cell area can be avoided.

In this case, the switching unit 220 shown in FIG. 3 is not necessary, and voltage drive of the memory cell can be performed from the pulse generator 210.

(Reading Unit)

The reading unit 300 is connected, for example, to the plurality of nano-gap memory elements 10 included in the nano-gap memory array 100 and to the control unit 400. The reading unit 300, for example, reads data from a nano-gap memory element 10 according to a control signal inputted from the control unit 400 and outputs the result of the reading to the control unit 400.

Specifically, to the reading unit 300, for example, is inputted from the control unit 400 address information about the location of a nano-gap memory element 10 from which data is to be read. When the information is inputted, the reading unit 300, for example, measures the resistance value between the nano-gap electrodes (the gap of the inter-electrode gap portion 4) of the nano-gap memory element 10 specified by the address information among the nano-gap memory elements 10 included in the nano-gap memory array 100, and thereby reads data from the nano-gap memory element 10.

(Control Unit)

The control unit 400 performs control to apply a voltage pulse with a predetermined voltage value and a preset, constant pulse width to an arbitrary nano-gap memory element 10 by inputting a control signal (voltage value information, etc.) to the pulse generator 210 in the voltage applying unit 200 and inputting address signals to the X-direction and Y-direction address specifying units 410 and 420.

At this time, when switching the state of the nano-gap memory element 10 from a low-resistance state (hereinafter, also referred to as an "ON state") to a high-resistance state (hereinafter, referred to as an "OFF state"), the control unit 400 performs control to apply a first voltage pulse to the nano-gap memory element 10 by controlling the switching element 222 such that the switching unit 220 is placed in the first connection state, and then allowing the pulse generator 210 to generate a pulse at the set voltage.

When switching the state of the nano-gap memory element 10 from the high-resistance state ("OFF state") to the low-resistance state ("ON state"), control is performed to apply a second voltage pulse to the nano-gap memory element 10 by controlling the switching element 222 such that the switching unit 220 is placed in the second connection state, and then allowing the pulse generator 210 to generate a pulse in the same manner as the first voltage pulse.

In addition, when, for example, the second voltage pulse is applied, the control unit 400 inputs a control signal (address information, etc.) to the reading unit 300 to read data from the nano-gap memory element. Then, based on the result of the reading, the control unit 400 determines whether the nano-gap memory element 10 has shifted from the high-resistance state to the low-resistance state.

If, as a result of the determination, the nano-gap memory element 10 has not shifted from the high-resistance state to the low-resistance state, then control may be performed to retry application of the second voltage pulse.

(Variation of a Nano-Gap Memory Element)

Note that the present invention is not limited to the above-described embodiment, and various modifications and design changes may be made thereto without departing from the gist and scope of the present invention.

A variation of a nano-gap memory element according to the present invention will be described below.

Figure 4:
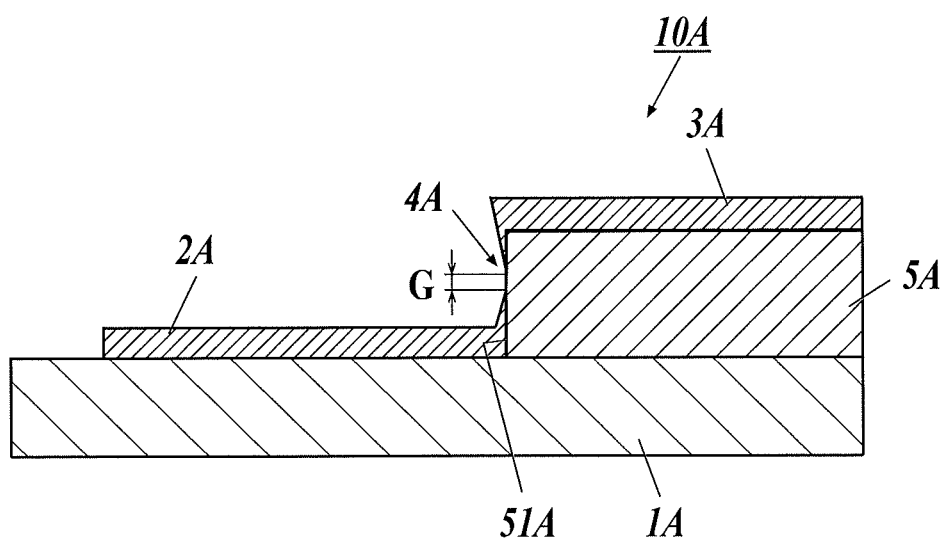
FIG. 4 is a cross-sectional view schematically showing a main part of another nano-gap memory element.

A nano-gap memory element 10A of a first variation mainly includes, for example, as shown in FIG. 4, an insulating substrate 1A, an insulator 5A provided on a top surface of the insulating substrate 1A, a first electrode 2A provided on the top surface of the insulating substrate 1A, a second electrode 3A provided on a top surface of the insulator 5A, and an inter-electrode gap portion 4A provided between the first electrode 2A and the second electrode 3A.

Specifically, by the insulator 5A being provided on the top surface of the insulating substrate 1A, a step portion is formed. By the insulator 5A, the first electrode 2A and the second electrode 3A are disposed on the substrate 1A at different levels. The first electrode 2A is provided in contact with the top surface of the insulating substrate 1A and with a lower portion of a side 51A of the insulator 5A. The second electrode 3A is provided in contact with the top surface of the insulator 5A and with an upper portion of the side 51A of the insulator 5A. The inter-electrode gap portion 4A is provided between the first electrode 2A provided at the lower portion of the side 51A of the insulator 5A and the second electrode 3A provided at the upper portion of the side 51A of the insulator 5A. That is, the inter-electrode gap portion 4A has a gap G formed in a height direction of the step portion formed by the insulator 5A.

Note that for the material of the first electrode 2A and the second electrode 3A it is desirable to select the same one as that of the aforementioned first electrode 2 and second electrode 3.

The insulator 5A is used to dispose a facing part of the first electrode 2A and a facing part of the second electrode 3A which form the inter-electrode gap portion 4A such that the facing parts are arranged side by side in a height direction relative to the plane of the substrate 1A. Therefore, as long as the above-described function is provided, any other structure may be adopted.

In addition, the insulator 5A, for example, may be one obtained by providing an oxide film, etc., on a part of the insulating substrate 1A, or may be formed by providing an oxide film, etc., on the entire surface of the insulating substrate 1A and removing a part of the oxide film, etc. For the material of the insulator 5A, it is preferred to use, for example, glass, oxides such as silicon oxide ($SiO_2$) and nitrides such as silicon nitride ($Si_2N_4$). Among them, silicon oxide ($SiO_2$) is ideal in terms of high adhesiveness to the first electrode 2A and the second electrode 3A and high flexibility in fabrication thereof.

The substantial structure of the inter-electrode gap portion 4A is almost the same as that of the aforementioned inter-electrode gap portion 4, except that the orientation of a plane to be formed is different. Therefore, the design conditions of the inter-electrode gap portion 4A such as dimensions and the operation method for the inter-electrode gap portion 4A are the same as those in the case of the aforementioned inter-electrode gap portion 4.

By the memory element 10A, of the first variant, the same technical effect as that of the aforementioned memory element 10 is provided, and the first electrode 2A and the second electrode 3A are disposed at different levels by a step portion formed by the insulator 5A on the top surface of the insulating substrate 1A, and the inter-electrode gap portion 4A is formed in a height direction thereof. Thus, compared to the case in which the first electrode 2A, the second electrode 3A, and the inter-electrode gap portion 4A are disposed side by side on the same plane, the area occupied by the inter-electrode gap portion 4A, as viewed from the top of the insulating substrate 1A can be reduced. By virtue of the structure, when, for example, memory elements are formed by sharing a single insulating substrate 1A and integrating multiple memory elements 10A, it is advantageous in integration, enabling to achieve miniaturization of the memory elements.

EXAMPLES

The present invention will be described in more detail below by specific examples, but the present invention is not limited thereto.

Here, examples using the nano-gap memory element 10A shown in FIG. 4 will be explained. Note that needless to say the nano-gap memory element 10 may be adopted.

Application of a first voltage pulse and a second voltage pulse to the nano-gap memory element 10A was repeatedly and alternately performed, and the resistance value between the nano-gap electrodes (the gap of the inter-electrode gap portion 4A) of the nano-gap memory element 10A was measured after the application of each voltage pulse. Upon application of both the first voltage pulse and the second voltage pulse, a voltage of the voltage pulse generated from the pulse generator 210 was set to 10 V and the pulse width (the application time of one voltage pulse) was set to 100 μs. As the resistance element of the switching unit 220 in the voltage applying unit 200, one having 1 MΩ was used.

As a comparative example, using the same nano-gap memory element 10A, the pulse generator 210 and the nano-gap memory element 10A were directly connected to each other without using the switching unit 220. The applied voltage of the second voltage pulse was set to be lower than that of the first voltage pulse, and the first voltage pulse and the second voltage pulse were alternately and repeatedly applied, and then the resistance value between the nano-gap electrodes (the gap of the inter-electrode gap portion 4A) of the nano-gap memory element 10A at that time was measured after the application of each voltage pulse. In the comparative example, the first voltage pulse was set to 10 V, the second voltage pulse was set to 5 V, and the pulse width of both voltage pulses was set to 500 ns.

Figure 5:
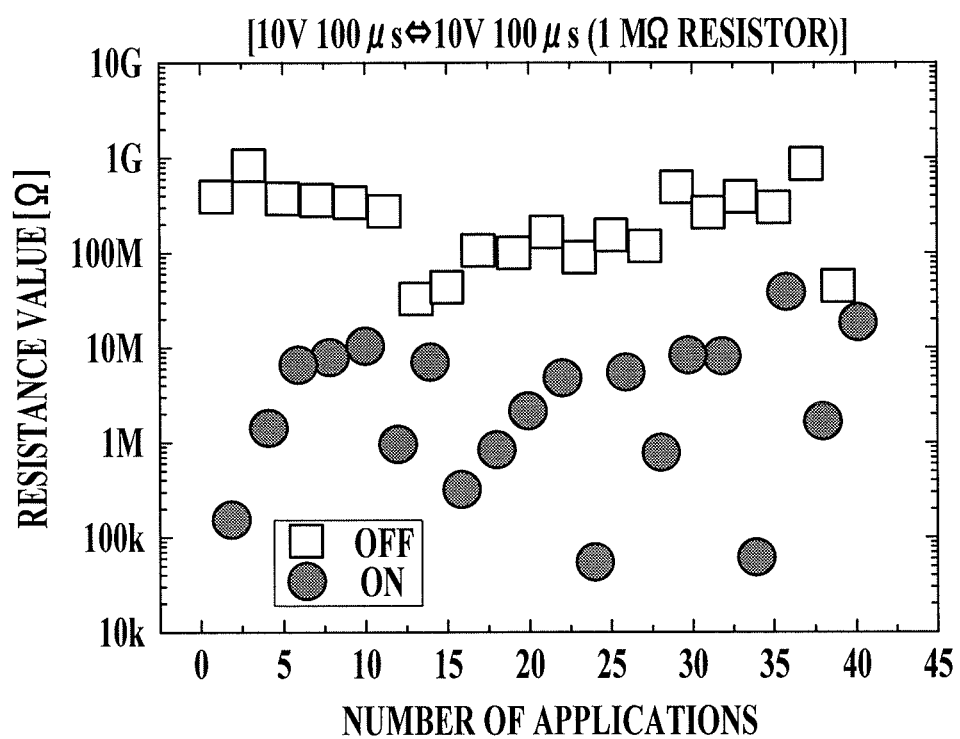
FIG. 5 is a graph showing change of resistance values of a nano-gap memory element according to an embodiment when a first voltage pulse that allows the element to shift from a low-resistance state to a high-resistance state and a second voltage pulse that allows the element to shift from the high-resistance state to the low-resistance state are alternately and repeatedly applied.
Figure 6:
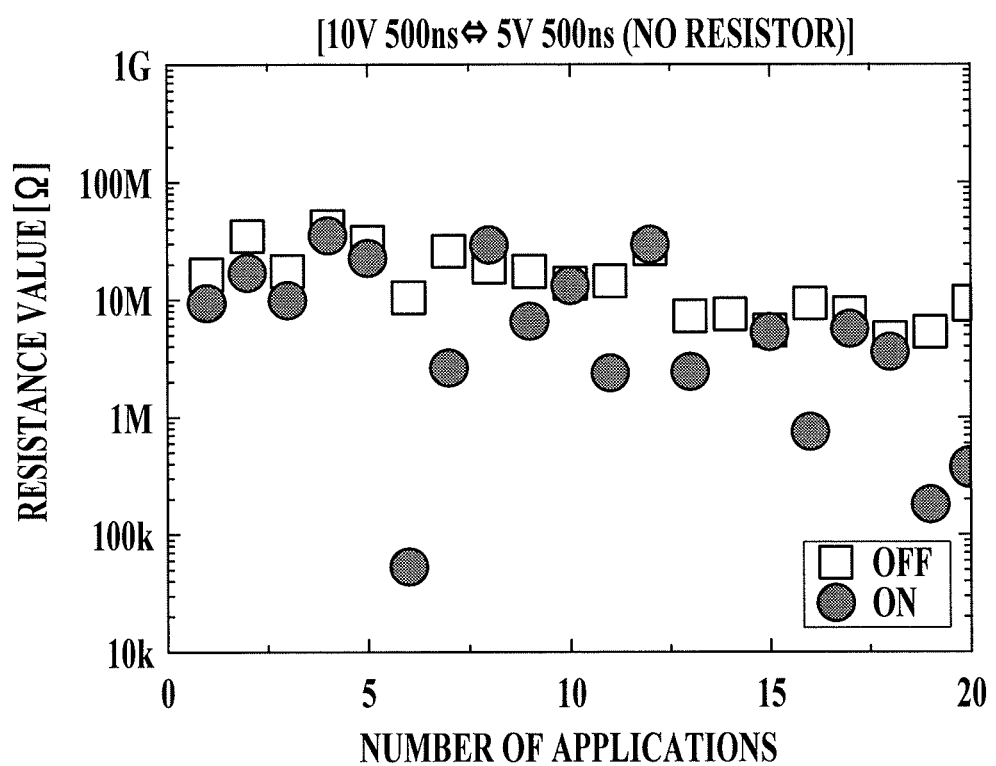
FIG. 6 is a graph showing change of resistance values of a nano-gap memory element according to a comparative example when a first voltage pulse that allows the element to shift from a low-resistance state to a high-resistance state and a second voltage pulse that allows the element to shift from the high-resistance state to the low-resistance state are alternately and repeatedly applied.

FIG. 5 is a graph showing resistance values for each application of the first voltage pulse and the second voltage pulse in the example. FIG. 6 is a graph showing resistance values for each application of the first voltage pulse and the second voltage pulse in the comparative example. In each graph, □ represents resistance values upon application of the first voltage pulse (at OFF) and ● represents resistance values upon application of the second voltage pulse (at ON).

In both of the example and the comparative example, the tendency appears that the resistance value rises upon application of the first voltage pulse, and the resistance value drops upon application of the second voltage pulse.

However, in the case of the comparative example, as shown in FIG. 6, there are many cases in which the state is not sufficiently switched from the high-resistance state to the low-resistance state after application of the second voltage pulse, and there are many variations in both the resistance value after application of the first voltage pulse and the resistance value after application of the second voltage pulse, causing significant overlap between the numerical range of resistance of the high-resistance state and the numerical range of resistance of the low-resistance state. As a result, when the nano-gap memory element 10A is used as one storage element in a storage device, identification of ON and OFF is difficult, resulting in insufficient practicality.

On the other hand, in the example, as shown in FIG. 5, variations in both the resistance values of the nano-gap memory element 10A after application of the first voltage pulse and the resistance values of the nano-gap memory element 10A after application of the second voltage pulse are suppressed to a small level, and there is almost no overlap between the numerical range of resistance of the high-resistance state and the numerical range of resistance of the low-resistance state. That is, it can be seen that by determining a certain threshold value, whether the nano-gap memory element 10A is in an ON state or an OFF state can be more securely identified, and thus, practicality as a storage device is improved.

Figure 7:
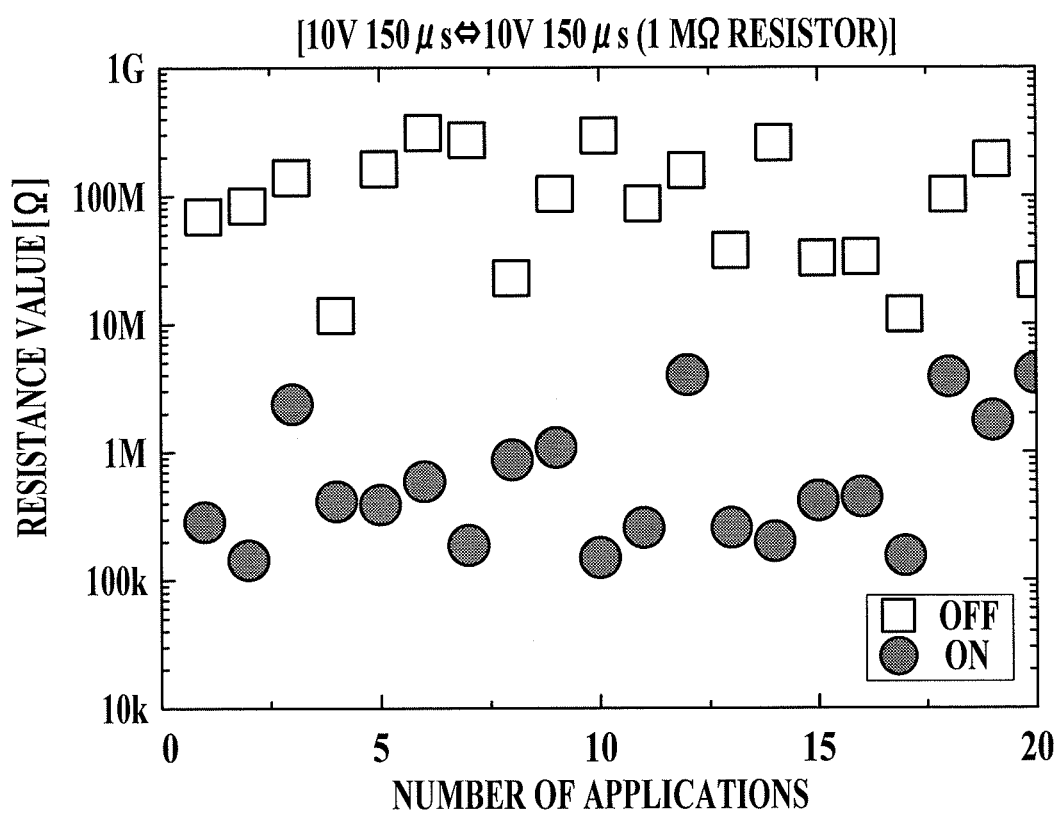
FIG. 7 is a graph showing change of resistance values of a nano-gap memory element according to another embodiment having the same structure as the embodiment but is applied voltage pulses of different pulse width from the embodiment when a first voltage pulse that allows the element to shift from a low-resistance state to a high-resistance state and a second voltage pulse that allows the element to shift from the high-resistance state to the low-resistance state are alternately and repeatedly applied.

FIG. 7 shows the results of measurement of the resistance value of the nano-gap memory element 10A when the same test as that of FIG. 5 is conducted, with the pulse width used upon application of the first voltage pulse and the second voltage pulse being set to 150 microseconds, in contrast to the example of FIG. 5.

In an example of FIG. 7, as with FIG. 5, it can be seen that variations in both the resistance values of the nano-gap memory element 10A after application of the first voltage pulse and the resistance values of the nano-gap memory element 10A after application of the second voltage pulse are suppressed to a small level, and the numerical range of resistance of the high-resistance state and the numerical range of resistance of the low-resistance state are favorably separated from each other, and thus, identification of the ON and OFF states of the nano-gap memory element 10A can be easily performed, and accordingly, practicality as a storage device is improved.

(Advantageous Effects of Embodiment of the Invention)

As described above, in the storage device 1000, in the switching unit 220 in the voltage applying unit 200, application of a first voltage pulse to a nano-gap memory element 10 (or 10A) is directly performed from the pulse generator 210, and application of a second voltage pulse to the nano-gap memory element 10 (or 10A) is performed through the series-connected resistance element 221.

By virtue of the structure, upon application of the second voltage pulse, a smaller current can be passed to the nano-gap memory element 10 (or 10A). Hence, variations in both the resistance values of the nano-gap memory element 10 (or 10A) after application of the first voltage pulse and the resistance values after application of the second voltage pulse can be suppressed to a small level, enabling to effectively suppress overlap between the numerical range of the resistance value of the high-resistance state and the numerical range of the resistance value of the low-resistance state. Therefore, an improvement in the reliability and practicality of the nano-gap memory element 10 (or 10A) as a storage element can be achieved.

In addition, application of the first voltage pulse and the second voltage pulse is selectively performed by the switching unit 220 by selecting the use of the resistance element 221. Thus, an output voltage from the pulse generator can be left constant, enabling to perform stable voltage application.

(Others)

By sealing a part (e.g., the nano-gap memory array 100) or whole of the storage device 1000 with a predetermined sealing member, the inter-electrode gap portions 4 may be prevented from exposing to air or moisture. The nano-gap memory elements 10 (or 10A) can be allowed to operate more stably. Furthermore, by sealing with the predetermined sealing member, a state in which the inter-electrode gap portions 4 are disposed in an arbitrary atmosphere can be maintained, and thus, the nano-gap memory elements 10 (or 10A) can be used in the arbitrary atmosphere.

The voltage value and pulse width of the first and second voltage pulses can be appropriately changed depending on the dimensions of the gap of the nano-gap memory elements, the selected material of the electrodes, the component of an atmosphere in the gaps, etc. In addition, the resistance value of the resistance element 221 is not strictly limited to 1 MΩ, and an advantageous effect can be obtained even in a range from 3 MΩ to 0.3 MΩ, more desirably, in a range of about 1 MΩ between 2 MΩ and 0.5 MΩ. Furthermore, the resistance value of the resistance element 221 can be appropriately selected according to the voltage value of the first and second voltage pulses, the resistance values for the high resistance and low resistance of the nano-gap memory elements, etc., in addition to the above conditions, and thus is not limited to that of the above-described example.

Although in the storage device 1000 the case of storing in the nano-gap memory array 100 is exemplified, a device composed of a nano-gap memory element 10 which is a single unit and a voltage applying unit 200, a reading unit 300, and a control unit 400 for the nano-gap memory element 10 may be used as a storage device.

Although in the above-described storage device 1000 the voltage applying unit 200 performs application through the resistance element 221 only for the second voltage pulse, the configuration may be such that the first voltage pulse is also applied through a resistance element. Note, however, that for the resistance element used upon application of the first voltage pulse, one having a lower resistance value than the resistance element 221 used upon application of the second voltage pulse is selected to adjust the value of current flowing through the nano-gap memory element 10 upon application of the first voltage pulse to be higher than that upon application of the second voltage pulse.

INDUSTRIAL APPLICABILITY

There is applicability in the field of memory elements in which ON and OFF can be switched by application of a voltage pulse.

REFERENCE SIGNS LIST

1: insulating substrate
2: first electrode
3: second electrode
4: inter-electrode gap portion 10: nano-gap memory element (memory element)
200: voltage applying unit
210: pulse generator (pulse generating source)
220: switching unit
221: resistance element (resistor)
1000: storage device

What is claimed is:

1. A drive method for a memory element, the memory element comprising an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs by application of a predetermined voltage between the first electrode and the second electrode, wherein a state of the memory element can be shifted from a predetermined low-resistance state to a predetermined high-resistance state and from the high-resistance state to the low-resistance state by application of a voltage pulse, the method comprising:

reducing a current value after a change of a resistance value, by performing, at least upon shifting from the high-resistance state to the low-resistance state, application of a voltage pulse to a memory element from a pulse generating source through a series-connected resistor; and performing application of the voltage pulse, in a case of shifting from the high-resistance state to the low-resistance state, such that an electrical resistance between the pulse generating source and the memory element becomes higher than the electrical resistance in a case of shifting from the low-resistance state to the high-resistance state.

2. The drive method for a memory element according to claim 1, wherein the resistance value of the resistor in the case of shifting from the high-resistance state to the low-resistance state is from 3 MΩ to 0.3 MΩ.

3. A storage device, comprising:

a memory element comprising an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs by application of a predetermined voltage between the first electrode and the second electrode; and a voltage applying unit that applies a voltage pulse to perform shifting from a predetermined low-resistance state to a predetermined high-resistance state and shifting from the high-resistance state to the low-resistance state between the first and second electrodes of the memory element, wherein the voltage applying unit comprises:

a pulse generating source that generates a constant voltage pulse; a resistor for reducing current after a change of a resistance value that flows through the memory element by the voltage pulse applied at least upon shifting from the high-resistance state to the low-resistance state; and a switching unit that performs switching such that, in a case of shifting from the high-resistance state to the low-resistance state, an electrical resistance between the pulse generating source and the memory element becomes higher than the electrical resistance in a case of shifting from the low-resistance state to the high-resistance state.

4. The storage device according to claim 3, wherein the resistance value of the resistor in the case of shifting from the high-resistance state to the low-resistance state is from 3 MΩ to 0.3 MΩ.

5. A storage device, comprising:

a plurality of memory elements, each comprising an insulating substrate; a first electrode and a second electrode provided on the insulating substrate; and an inter-electrode gap portion provided between the first electrode and the second electrode and having a gap of an order of nanometers where a phenomenon of a change in resistance value between the first and second electrodes occurs by application of a predetermined voltage between the first electrode and the second electrode; and a voltage applying unit that applies a voltage pulse to perform shifting from a predetermined low-resistance state to a predetermined high-resistance state and shifting from the high-resistance state to the low-resistance state between the first and second electrodes of the memory element, wherein a resistor is connected to each of the plurality of memory elements, and the voltage applying unit comprises a switching unit that performs switching such that, in a case of shifting from the high-resistance state to the low-resistance state, an electrical resistance between the pulse generating source and the memory element becomes higher than the electrical resistance in a case of shifting from the low-resistance state to the high-resistance state.

6. The storage device according to claim 5, wherein the resistance value of the resistor in the case of shifting from the high-resistance state to the low-resistance state is from 3 MΩ to 0.3 MΩ.

* * * * *